(12) United States Patent
Tuominen et al.

(10) Patent No.: US 11,083,081 B2
(45) Date of Patent: Aug. 3, 2021

(54) ELECTRONIC PACKAGE COMPRISING A DECOUPLING LAYER STRUCTURE

(71) Applicant: AT&S Austria Technologie & Systemtechnik Aktiengesellschaft, Leoben (AT)

(72) Inventors: Mikael Tuominen, Shanghai (CN); Seok Kim Tay, Singapore (SG)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 8 days.

(21) Appl. No.: 16/687,068

(22) Filed: Nov. 18, 2019

(65) Prior Publication Data
US 2020/0163206 A1 May 21, 2020

(30) Foreign Application Priority Data

Nov. 20, 2018 (CN) .......................... 201811384891.X

(51) Int. Cl.
| | |
|---|---|
| *H05K 1/02* | (2006.01) |
| *H05K 1/03* | (2006.01) |
| *H05K 1/11* | (2006.01) |
| *H05K 1/18* | (2006.01) |
| *H05K 3/46* | (2006.01) |

(52) U.S. Cl.
CPC ......... *H05K 1/0271* (2013.01); *H05K 1/0373* (2013.01); *H05K 1/113* (2013.01); *H05K 1/186* (2013.01); *H05K 3/4644* (2013.01); *H05K 2201/0195* (2013.01); *H05K 2201/068* (2013.01); *H05K 2201/09136* (2013.01)

(58) Field of Classification Search
CPC ....................................................... H05K 1/02
USPC ............................................................ 361/752
See application file for complete search history.

(56) References Cited

U.S. PATENT DOCUMENTS

| | | |
|---|---|---|
| 7,719,104 B2 | 5/2010 | Hsu et al. |
| 7,768,119 B2 | 8/2010 | Chia |
| 8,399,778 B2 | 3/2013 | Hsu |
| 2002/0140095 A1 | 10/2002 | Funakura et al. |

(Continued)

FOREIGN PATENT DOCUMENTS

| | | |
|---|---|---|
| EP | 3 231 261 A1 | 10/2017 |
| EP | 3 231 262 A1 | 10/2017 |

(Continued)

OTHER PUBLICATIONS

Ko, Cheng-Ta et al: "Next Standard Packaging Method for DRAM—Chip-in Substrate Package", International Microsystems, Packaging, Assembly Conference Taiwan, Oct. 20, 2006 (Oct. 20, 2006), pp. 1-6, XP055684474, US; DOI: 10.1109/IMPACT.2006.312198; ISBN: 978-1-4244-0735-4.

(Continued)

*Primary Examiner* — Stanley Tso
(74) *Attorney, Agent, or Firm* — Robert A. Blaha; Smith Tempel Blaha LLC

(57) ABSTRACT

An electronic package having a base structure; a layer stack formed over the base structure; and a component embedded at least partially within the base structure and/or within the layer stack. The layer stack has a decoupling layer structure, the decoupling layer structure with a decoupling material having a Young Modulus being smaller than 1 GPa.

20 Claims, 3 Drawing Sheets

(56) References Cited

U.S. PATENT DOCUMENTS

| | | | | |
|---|---|---|---|---|
| 2005/0098890 A1* | 5/2005 | Blaszczak | ............... | H01L 24/29 |
| | | | | 257/753 |
| 2011/0259630 A1 | 10/2011 | Park | | |
| 2013/0026632 A1* | 1/2013 | Kikuchi | ............... | H01L 23/552 |
| | | | | 257/753 |
| 2013/0277819 A1 | 10/2013 | Yoshida | | |
| 2013/0307113 A1 | 11/2013 | Kunimoto | | |
| 2017/0339784 A1* | 11/2017 | Zluc | ....................... | H05K 1/189 |
| 2020/0067139 A1* | 2/2020 | Hashiwaki | ........ | H01M 10/0567 |

FOREIGN PATENT DOCUMENTS

| | | |
|---|---|---|
| WO | 2016091992 A1 | 6/2016 |
| WO | 2016091995 A1 | 6/2016 |

OTHER PUBLICATIONS

Anonymous: Insulating Film "ABF" Ajinomoto Fine-Techno Co., Inc., May 18, 2020 (May 18, 2020), Retrieved from the Internet: URL:https://www.aft-website.com/en/electron/abf.

Schweiger, Dietmar; European Search Report in Application No. 19208803.7; Apr. 21, 2020; pp. 1-10; European Patent Office; 80298, Munich, Germany.

\* cited by examiner

ELECTRONIC PACKAGE COMPRISING A DECOUPLING LAYER STRUCTURE

CROSS-REFERENCE TO RELATED APPLICATION

This application claims the benefit of the filing date of Chinese Patent Application No. 201811384891.X, filed Nov. 20, 2018, the disclosure of which is hereby incorporated herein by reference.

TECHNICAL FIELD

Embodiments of the invention generally relate to the field of component carriers such as printed circuit boards which are typically used as a mounting base for mechanically attaching and electrically interconnecting electronic components of an electronic assembly formed on or at a component carrier. Specifically, embodiments of the invention relate to an electronic package comprising a base structure, a layer stack formed on the base structure, and a component embedded within the base structure and/or the layer stack. Further, the present invention relates to a method for manufacturing such an electronic package.

TECHNOLOGICAL BACKGROUND

In the field of fabrication of electronic (consumer) products it becomes more and more important to provide a component carrier such as a printed circuit board (PCB) which comprises an embedded (electronic) component. Embedding a component within the component carrier may contribute to a further integration of electronic functionality within a comparatively small electronic assembly or electronic package. For instance, an embedded component comprising an RFID chip and a corresponding RF antenna may be used for a traceability of an individual component carrier during a fabrication of a plurality of electronic assemblies. This may be relevant in particular for the fabrication of safety relevant electronic assemblies for instance in the automotive industry. Such a safety relevant electronic assembly might be for instance a controller for an airbag.

An embedded component may cause thermal stress not only during the manufacturing of the corresponding electronic assembly but also during its operation. Such a thermal induced mechanical stress may be caused by a difference in the Coefficient of Thermal Expansion (CTE) of (i) printed circuit board materials, e.g. FR4, of the component carrier on the one hand and (ii) semiconductor materials, e.g. silicon, of the embedded component on the other hand. It is obvious that such a mechanical stress regularly results in a warpage of the component carrier which is a highly unwanted effect because it reduces the operational reliability of an electronic assembly formed on or at the component carrier.

WO 2016/091995 A1 discloses an electronic package comprising a component carrier and an electronic component embedded therein. For embedding a dielectric material is used which exhibits a Young Modulus between 1 GPa and 20 GPa and a very small CTE being in the range between 0 and 17 ppm. According to WO 2016/091995 A1 the combination of (i) the extremely small CTE, which causes only little thermal induced mechanical stress, and (ii) the small Young Modulus, which receives and absorbs respectively compensates the mechanical stress, yields a spatial stability of the electronic package which results in a reduced warpage.

SUMMARY

In view of the matter of fact that there is always a desire of a further miniaturization and higher integration density of electronic packages there is a need to further reduce any spatial instability of electronic packages.

This need may be met by the subject matter according to the independent claims. Advantageous embodiments of the present invention are described by the dependent claims.

According to a first aspect there is provided an electronic package. The provided electronic package comprises (a) a base structure; (b) a layer stack formed over the base structure; and (c) a component embedded at least partially within the base structure and/or within the layer stack. The layer stack comprises a decoupling layer structure, the decoupling layer structure comprising a decoupling material having a Young Modulus being smaller than 1 GPa.

OVERVIEW OF EMBODIMENTS

The described electronic package is based on the idea that by using a decoupling material with an extremely small Young Modulus thermal induced mechanical stress can be received and can be absorbed by the decoupling material with an appropriate deformation (of the decoupling material). In this context it has been found out that in contrast to known concepts and approaches in the described electronic package the value of the Coefficient of Thermal Expansion (CTE) of the decoupling material does not play such an important role for an efficient warpage reduction.

In this document the term "base structure" may refer to any structure of the described electronic package which provides for at least some mechanical stability. The base structure may comprise or may consist of at least one of (i) an electrically insulating layer structure, (ii) an electrically conductive layer structure, e.g. made from copper, and (iii) a core structure, e.g. a core structure known from printed circuit boards. The base structure may also be realized with a multilayer buildup layer structure of such structures.

In this document the term "decoupling material" may refer to the mechanical "softness" of the decoupling material. It is obvious that a soft material which can receive and, due to an appropriate deformation, compensate or absorb mechanical stress mechanically decouples (at least partially) one portion of the electronic package formed at one side of the decoupling layer structure from another portion of the electronic package formed at the other side of the decoupling layer structure.

Depending on the specific (spatial) configuration of the decoupling material also a mechanical stress might be reduced which acts onto an electric connection structure of the electronic package. Such a connection structure, which may comprise (i) conductive paths of appropriately patterned metallic layers and/or (ii) via connections between different layers of the layer stack, might be used for electrically contacting the embedded component and/or other components mounted at the described electronic package and/or being comprised by the electronic package.

The achieved low warpage may not only be of advantage during a (reliable) operation of the electronic package. A low warpage may also be important when the described electronic package is an intermediate product, which is subjected to a further processing in order to manufacture an electronic product which comprises the described electronic package.

A low warpage tendency is generally a behavior which is desired in typically any possible application. A low warpage behavior might be relevant in particular for applications wherein a lot of heat is generated within and/or by the embedded component. Typical high heat load applications are found in e.g. power modules which operate at a power being in the range between e.g. 0.5 W and several kW. For such applications the embedded component might be e.g. a high-power semiconductor switch such as e.g. an Insulated Gate Bipolar Transistor.

It is pointed out that the mentioned value for the Young Modulus refers to room temperature. In accordance with usual physical conventions in this document "room temperature" is a temperature of 20° C. which in other units or scales of temperature values is 293 Kelvin or 68° F.

An electrically insulating material which exhibits the above described extremely small Young Modulus and which also fulfills the other material specifications disclosed in this document may be obtained from the Japanese Company Ajinomoto. The material is denominated Ajinomoto Build-up Film™ (ABF). An ABF material is made from a resin composition combining organic epoxy resins, hardener, and inorganic filler micro-particles.

The described component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in a component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In the context of this document the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

The component carrier may be shaped as a plate. This may contribute to a compact design, wherein the component carrier nevertheless provides a large basis for mounting components thereon. Furthermore, in particular a naked die as an example for an embedded electronic component, can be conveniently embedded, thanks to its small thickness, into a thin plate such as a printed circuit board.

The component carrier may be configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of this document the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

According to an embodiment the decoupling material comprises or consists of a blend of at least one resin and at least one softening component. Alternatively or in combination, the decoupling material comprises or consists of a copolymer, for example a block copolymer, wherein at least one softening component is copolymerized into and/or is part of the polymer chain of the copolymer.

The at least one softening may make a significant contribution to the desired elasticity of the decoupling material. Copolymerizing the at least one softening component into the polymer chain may further provide the advantage that any migration of the at least one softening component out of the polymer is prevented.

According to an embodiment the decoupling material has a Young Modulus smaller than 0.5 GPa, in particular smaller than 0.2 GPa and more in particular smaller than 0.1 GPa. This may provide the advantage that the ability of absorbing and compensating mechanical stress is further reduced. By nature, this results in a further suppression of undesired warpage.

It is pointed out that the inventors have performed experiments with a material having a Young modulus of at least approximately 0.05 GPa which yields an almost complete warpage suppression.

According to a further embodiment the decoupling material has a Coefficient of Thermal Expansion (CTE). At a temperature smaller than the glass transition temperature the CTE is in the range between 10 ppm to 200 ppm and in particular between 30 ppm and 120 ppm. Alternatively or in combination, at a temperature larger than the glass transition temperature the CTE is in the range between 25 ppm to 800 ppm and in particular between 50 ppm and 400 ppm.

Combining the extremely small Young Modulus with a CTE which is larger than the CTE of an electrically insulating material being specified in WO 2016/091995 A1 and being used for similar applications may provide the advantage that material constraints for realizing the layer stack and/or the base structure are not so strict. Hence, the effort being needed to find and/or develop an appropriate material with the extremely small Young Modulus will be significantly smaller that the effort being needed to find and/or develop a material which exhibits on the one hand a little larger Young Modulus and on the other hand a significantly smaller CTE.

According to a further embodiment the base structure comprises a base material which exhibits a Young modulus being smaller than 5 GPa, in particular smaller than 2 GPa, and more in particular smaller than 1 GPa. This may provide the advantage that the ability of the described electronic package for absorbing and compensating mechanical stress will be further improved.

In preferred embodiments the base material is the same as the above described decoupling material.

According to a further embodiment the electronic package comprises at least one of the following features:

a) at room temperature the decoupling material comprises a reversible deformability being in the range between 1% and 10%, in particular in the range between 3% and 7% and more in particular in the range between 4% and 6%; and b) at 200° C. the decoupling material comprises a reversible deformability being in the range between 1% and 10%, in particular in the range between 3% and 7% and more in particular in the range between 4% and 6%.

In this context the term reversible deformability refers to the material behavior which is characterized in that upon exerting a certain pressure onto a material piece of the decoupling material a pressure dependent deformation will show up. After stopping this pressure exertion the deformation will degenerate until it disappears completely. Such a reversible deformability is often also referred to as elastic deformability.

In accordance with known temperature conversion rules a temperature of 200° C. corresponds to a temperature of 392° F.

According to a further embodiment the electronic package comprises at least one of the following features:

a) at room temperature the decoupling material comprises an irreversible deformability being in the range between 0.35% and 8%, in particular in the range between 0.5% and 6% and more in particular in the range between 1% and 4%;

b) at 200° C. the decoupling material comprises an irreversible deformability being in the range between 3.7% and 15%, in particular in the range between 3.8% and 12% and more in particular in the range between 4% and 10%; and c) at 200° C. the decoupling material comprises a creeping deformability over 180 minutes being in the range between 0.5% and 6%, in particular in the range between 0.8% and 4% and more in particular in the range between 1.2% and 2.5%.

Descriptively speaking, according to the embodiment described here the decoupling material exhibits, in addition to a certain reversible deformability also an irreversible deformability, which is significant in particular at higher temperatures.

In this context an irreversible deformability is a deformability which leads to permanent deformations even if a pressure exertion yielding a certain deformation is stopped. Such an irreversible deformability is often also denominated a plastic deformability, which is directly related to the so called creep behavior of the decoupling material.

At a microscopic level the phenomena of irreversible deformability can be understood in that, after being exposed to a certain mechanical stress the molecules of a certain portion of the decoupling material slide with respect to the molecules of another portion. Of course, the process of sliding is a gradually process which takes time. Thereby, the time for achieving a certain shift depends on the temperature.

Just for the sake of completeness it is mentioned that apart from the described plastic deformability there is the so called viscoelastic deformability, which can also be understood as to represent an irreversible deformability in the context of embodiments of the invention. On a microscopic level this (second) type of plastic deformability goes along with a spatial reorganization of the molecules, which reorganization takes place preferably at high temperatures (of course in the presence of a mechanical strain or stress).

According to a further embodiment the decoupling layer structure is formed directly at at least one side of the component.

Locating the decoupling layer structure very closely at the embedded component may provide the advantage of a soft accommodation/embedding of the component within or at the layer stack. This may increase the operational reliability of the described electronic package.

According to a further embodiment the electronic package further comprises an electric connection structure which is electrically connected with terminals of the component. The electric connection structure electrically connects the component with other components of the electronic package. Alternatively or in combination, the electric connection structure is configured for electrically connecting the component with circuitry being external to the electronic package. In accordance with these embodiments the electric connection structure is formed at least partially within the decoupling layer structure. This may provide the advantage that not only the component will be accommodated in a soft and reliable manner but also the electric connection structure will be embedded at least partially within a mechanically soft environment. Upon the presence or occurrence of mechanical stress within the region around the electric connection structure the decoupling layer structure will also receive and/or compensate this stress. As a result, the decoupling layer structure will also contribute in protecting the electric connection structure from damage.

According to a further embodiment the decoupling layer structure is formed directly at at least three sides of the component. This may provide the advantage that the softness of the accommodation of the embedded component within the layer stack will be further increased. Hence, the tendency and/or the amount of a warpage generation due to different CTEs of (i) the semiconductor material of the component and (ii) (electrically insulating material of) the layer stack and/or the base structure will be further reduced.

It is mentioned that the term at least three sides may refer to a two-dimensional illustration of the spatial configuration of the electronic package. Specifically, when taking into account the three-dimensional nature of the component at least five sides of the component may be in direct contact with the component carrier. Specifically, a bottom surface of the component will be in contact with the decoupling material and four neighboring side surfaces of the component will be in contact with the decoupling material.

According to a further embodiment the decoupling material is a material being free from a mesh, in particular being free from a fiber mesh. This may provide the advantage that the described decoupling layer structure can be realized by a comparatively wide range of (electrically insulating) materials. This can be understood from the fact that a mesh is usually used for mechanically stiffening the respective material. Hence, it should be clear that it is much easier to find and/or to develop a (decoupling) material which exhibits the above described extremely small Young Modulus and, if applicable, also the other above described material parameter values.

According to a further embodiment, within an XY-plane being parallel to the main planes of the layer stack, the embedded component has a length and/or a width of larger than 2 mm, in particular a length and/or a width larger than 5 mm and more in particular a length and/or a width larger than 10 mm.

Embedding such large components requires a low warpage and a low strain environment given by the described layer stack and/or the described base structure. Thereby, the above described low Young Modulus material provides a significant contribution to the low warpage and/or the low strain.

In this document the term "main planes" refers to planes having an orientation perpendicular to a thickness direction of the layer(s) of the layer stack.

According to a further embodiment, within an XY-plane being parallel to the main planes of the layer stack, the area ratio between the area of the component and the area of the entire package is larger than 10%, in particular larger than 20% and more particular larger than 30%. This means that along horizontal XY directions the size of the entire electronic package is not very much larger as compared to the size of the embedded component. Hence, the electronic package can be realized with a compact design. This may provide a beneficial contribution for a further miniaturization of electronic products.

According to a further embodiment the electronic package comprises at least one of the following features: (a) The layer stack comprises at least one electrically insulating layer structure made from a PCB material and (b) the layer stack comprises at least one electrically conductive layer structure made from a PCB material.

Within the at least one electrically insulating layer structure there may be formed via connections which electrically interconnect different (patterned) electrically conductive layer structures. The via connections may form at least a part of the above described connection structure and may be used for electrically contacting the embedded component with other circuitry formed within and/or at the described electronic package and/or with the "outside world". In this respect it is mentioned that the above described mechanical decoupling property caused by the decoupling material may also have a positive effect on such via connections such that the electric connection of the embedded component is more reliable, in particular under high temperature conditions during operation and/or manufacturing processes.

The electrically insulating layer structure may be made or may comprise a material which comprises at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Teflon is a registered trademark of The Chemours Company FC, LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based Build-Up Film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

The electrically conductive layer structure may be made or may comprise a material which comprises at least one of the group consisting of copper, aluminum, nickel, silver, gold, palladium, and tungsten. Although copper is usually preferred, other materials or coated versions thereof are possible as well, in particular coated with supra-conductive material such as graphene.

According to a further aspect there is provided a method for manufacturing an electronic package and in particular an electronic package as described above. The provided method comprises (a) providing a base structure; (b) forming a layer stack over the base structure, wherein the layer stack comprises a decoupling layer structure, the decoupling layer structure comprising a decoupling material having a Young Modulus being smaller than 1 GPa; and (c) embedding a component at least partially within the base structure and/or within the layer stack.

Also, the described method is based on the idea that a decoupling material with an extremely small Young Modulus has the beneficial effect of an efficient absorption of mechanical stress which might be caused in particular by different CTEs of materials being comprised in the electronic package. Thereby, it has been found out by the inventors that surprisingly the value of the CTE of the decoupling material is only of minor relevance for the desired effect of the mechanical stress absorption and/or compensation.

The process of embedding at least partially the component can be realized in different manners.

In some embodiments the component is embedded by pressing the component into the decoupling material such that the decoupling material is in direct contact with the component at at least one and preferably at at least three sides of the component. When not considering the electronic package in a two-dimensional illustration by taking into account the three dimensionality of the component at least five sides of the component may be in direct contact with the component carrier. Specifically, a bottom surface of the component will be in contact with the decoupling material and four neighboring side surfaces of the component may be in contact with the decoupling material.

In other embodiments the decoupling material can be formed by means of additive manufacturing around the (already placed) component. This means that after placing the component in a particular position the decoupling material is formed at least partially around the side surfaces of the component.

It has to be noted that embodiments of the invention have been described with reference to different subject matters. In particular, some embodiments have been described with reference to a method type claim whereas other embodiments have been described with reference to apparatus type claims. However, a person skilled in the art will gather from the above and the following description that, unless otherwise noted any combination of features belonging to one type of subject matter also any combination between features relating to different subject matters, in particular between features of the method type claim and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1:
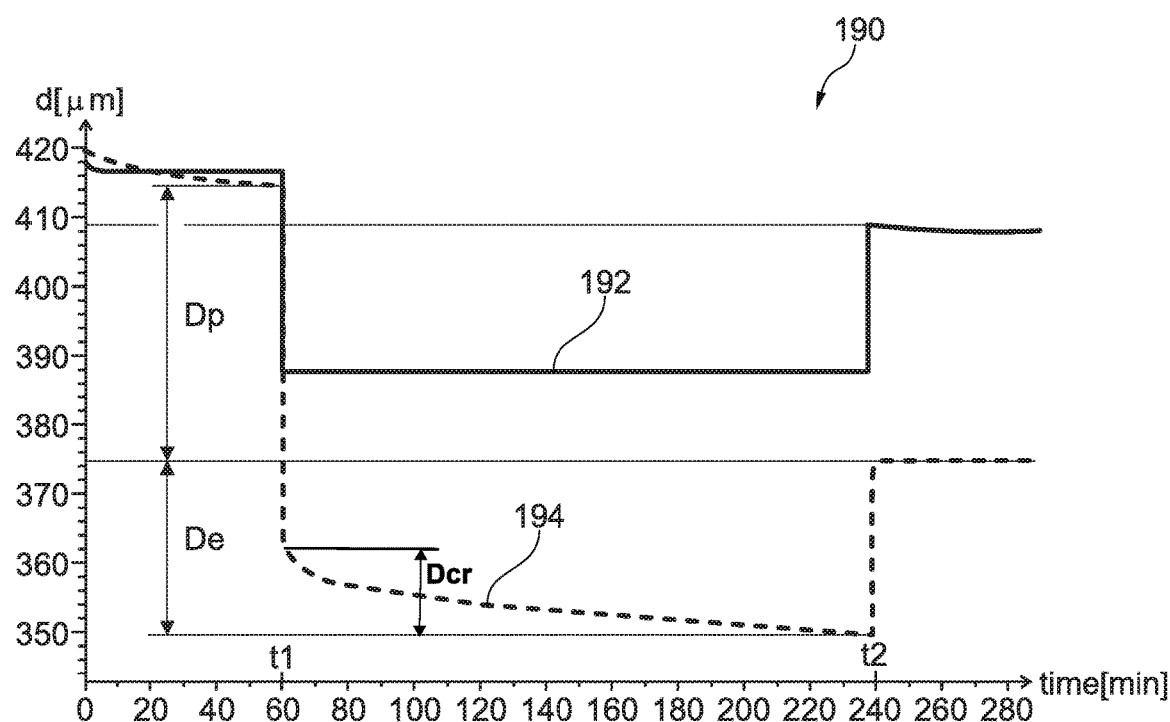
FIG. 1 shows the result of deformation experiments with a decoupling material exhibiting both an elastic or reversible deformability and a plastic or irreversible deformability.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features, which have already been elucidated with respect to a previously described embodiment, are not elucidated again at a later position of the description.

FIG. 1 shows a diagram 190 illustrating the deformation behavior of a material piece of the decoupling material used in electronic packages in accordance with embodiments of the invention. The deformation behavior was experimentally studied by means of a Thermo Mechanical Analysis (TMA). On the axis of the abscissa there is depicted the quantity "time" in the unit "minutes". The "time range" depicted in FIG. 1 is from 0 minutes to 280 minutes (min). On the axis of the ordinate there is depicted the quantity "thickness" (d) of the material piece under investigation in the unit "micrometer" ($\mu$m). The "thickness range" is from approximately 344 $\mu$m to 420 $\mu$m. The thickness d is measured between a pressure stamp and a back-plate sandwiching the material piece. The full line 192 shows a deformation curve of the material piece at room temperature. The dashed line 194 shows a deformation curve of the material piece obtained at a temperature of 200° C.

At t=0 the respective deformation test starts with placing the material piece into a deformation measurement apparatus. Thereby, a very small force of 0.01 Newton (N) is exerted onto a stamp abutting the material piece in order to keep the material piece in place. Both deformation curves 192 and 194 have (at the beginning) a negative slope. For the curve 194 at 200° C. this negative slope is much more pronounced.

At a time t=t1=60 minutes the force is increased to 1 N. Both curves 192 and 194 show a stepwise compression of the material piece. The "size" of the step is much larger for the curve 194. This is in accordance with an expected behavior according to which at a higher temperature the decoupling material is softer.

In the time window starting at t1 the thickness for the material piece at room temperature stays basically the same (see curve 192). By contrast thereto, the curve 194 for the material piece at 200° C. shows a creeping further compression. Also, this behavior reflects the higher softness of the decoupling material at 200° C.

At a time t=t2=240 minutes the force is decreased again to 0.01 N. Both curves 192 and 194 show a "thickness increase step". The curve 192 reaches a thickness value of approximately 409 $\mu$m, which is only little smaller than the original thickness value of approximately 417 $\mu$m (at t=t1). The curve 194 reaches a thickness value of approximately 375 $\mu$m, which is significantly smaller than the previous thickness value of approximately 414 $\mu$m (at t=t1). For both curves 192 and 194 the difference between the thickness value at t=t1 (before the step) and the thickness value at t=t2 (after the step) is a measure for the irreversible or the plastic deformability of the decoupling material. The thickness difference at t=t2 before and after the step is a measure for the reversible or the elastic deformability. In FIG. 1 the corresponding measures Dp (plastic deformation), De (elastic deformation), and Dcr (creeping deformation) are shown for the curve 194, i.e. for the material piece at a temperature of 200° C.

Figure 2:
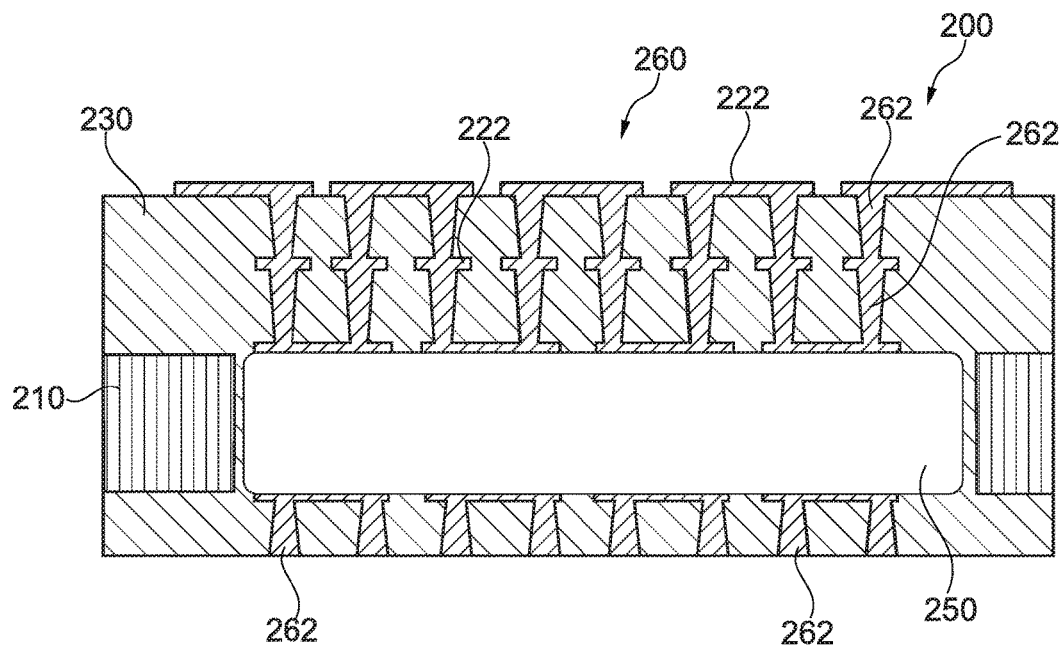
FIG. 2 shows an electronic package with an electronic component being embedded within a decoupling structure comprising a decoupling material being in contact with all side surfaces of the electronic component.

FIG. 2 shows an electronic package 200 in accordance with an embodiment of the invention. The electronic package 200 comprises a base structure 210, into which an opening has been formed. Within the opening there is located an electronic component 250. Above and below the electronic component 250 there is formed a decoupling layer structure 230, which comprises a mechanical decoupling material having an extremely small Young modulus of 0.05 GPa. As can be seen from FIG. 2, the lateral size of the opening is slightly larger than the lateral size of the component 250. The resulting gaps between the side surfaces of the component 250 and the inner sidewalls of the opening are also filled with the decoupling material having the extremely small Young modulus.

According to the embodiment described here the electronic component 250 is electrically connected with an electric connection structure 260. The electric connection structure 260 comprises several patterned metallic layers 222 and several vertical via interconnects 262. The electric connection structure 260 is provided for electrically connecting the component 250 with non-depicted external circuitry.

As can be seen from FIG. 2, the electronic component 250 is completely surrounded by or embedded in the soft decoupling material. This means that all six side surfaces of the component 250 are in direct mechanical contact with the decoupling material. Further, also the electric connection structure 260 is embedded within the decoupling material.

It is mentioned that the electronic package 200 can be a sub package of a larger electronic device. This means that the metallic portions of the electric connection structure 260, which portions are faced away from the electronic component 250, can be connected with electric conductive paths of a further built up structure formed above and/or below the electronic package 200. The decoupling material 230 mechanically decouples the electronic component 250 from such further built up structure(s).

Figure 3:
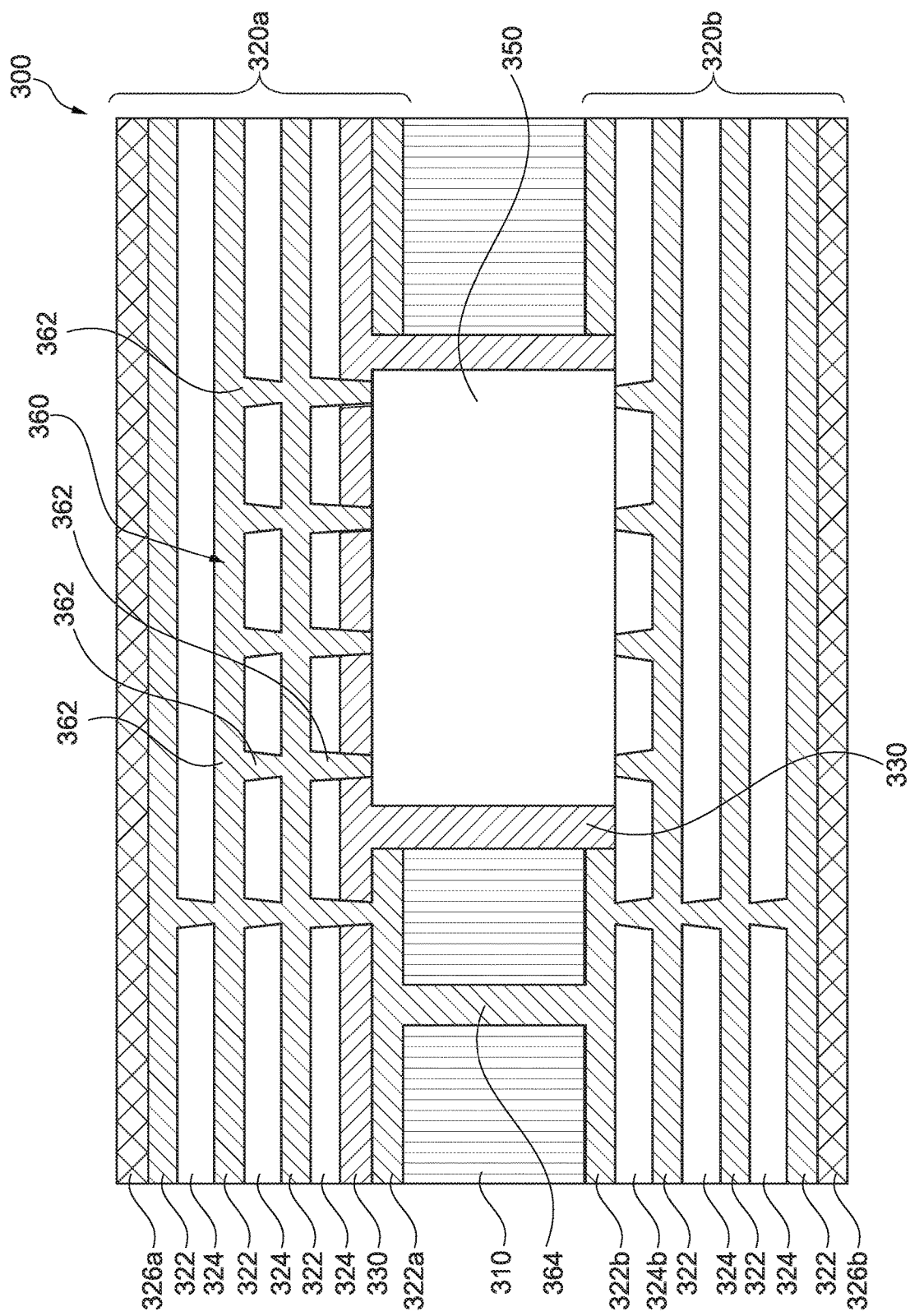
FIG. 3 shows an electronic package with an electronic component being embedded within a decoupling material which is in contact with the electronic component at five side surfaces of the electronic component, wherein in the 2D cross sectional view only three sides are visible.

FIG. 3 shows an electronic package 300 in accordance with a further embodiment of the invention. Also, the electronic package 300 comprises a base structure 310 into which an opening has been formed. Within this opening an electronic component 350 has been placed. Again, the lateral size of the component 350 is slightly smaller than the lateral size of the opening such that gaps are formed between the lateral side surfaces of the component 350 and the inner sidewalls of the opening.

At the upper surface of the base structure 310 there is formed a metal layer 322a and at the lower surface of the base structure 310 there is formed a metal layer 322b. According to the embodiment described here copper, a material being often used for PCB application, is used for the metal layers 322a and 322b (and for all further metal layers 322).

According to the embodiment described here a lower surface of the component 350 is vertically aligned with the lower surface of the metal layer 322b provided at the bottom surface of the base structure 310. This alignment has been achieved by forming an electrically insulating or dielectric layer 324b directly below the metal layer 322b and by placing the component 350 within the opening such that the lower surface of the component 350 abuts against the upper surface of this dielectric layer 324b. According to the exemplary embodiment described here the dielectric layer 324b (and all further dielectric layers 324) are made from a prepreg material knowing from PCB applications.

As can be seen from FIG. 3, directly above the component 350 and the metal layer 322a formed at the top surface of the base structure 310 there is formed a decoupling layer structure 330 which comprises a decoupling material having again at a Young modulus of 0.05 GPa. This decoupling material also fills the gaps between the inner sidewalls of the base structure 310 and the lateral side surfaces of the component 350. This means that according to the embodiment described here the top surface of the component 350 and the lateral side surfaces of the component 350 are in direct contact with the decoupling layer structure 330. When taking into account the matter of fact that the component 350 has also an extension along a direction being perpendicular to the plane of drawing, also the side surface of the component 350 being located below the plane of the drawing and the side surface of the component 350 being located above the plane of the drawing are in contact with the decoupling material. In other words, according to the embodiment described here only the lower surface of the component 350 is not in direct mechanical contact with the decoupling material but is in direct mechanical contact with the dielectric layer 324b.

Above and below the base structure 310 there is provided a layer stack. The layer stack above the base structure 310 is denominated with reference numeral 320a. The layer stack below the base structure 310 is denominated with reference numeral 320b.

In the nomenclature used in this document the upper layer stack 320a comprises the metal layer 322a and the upper layer of the decoupling layer structure 330. Further, the upper layer stack 320a comprises an alternating sequence of electrically conductive metal layers 322 and electrically insulating dielectric layers 324. Further, as illustrated a most upper layer the upper layer stack 320a comprises a solder mask layer 326a.

In the nomenclature used in this document the lower layer stack 320b comprises the metal layer 322b and the dielectric layer 324b. Further, the lower stack 320b comprises an alternating sequence of electrically conductive metal layers 322 and electrically insulating dielectric layers 324. Further, as a lowest layer the lower layer stack 320b comprises a solder mask layer 326b.

According to the embodiment described here an electric connection structure 360 is provided within the upper layer stack 320a. This electric connection structure 360 comprises several via interconnects 362 which electrically connect along the vertical direction different metal layers 322. Some of the via interconnects 362 penetrate the upper layer of the decoupling layer structure 330 (in order to electrically connect the electronic component 350).

Just for the sake of completeness it is mentioned that according to the embodiment described here the electronic component 350 is also electrically connected at its lower surface by means of via interconnects which in FIG. 3 are not denominated with reference numerals. Last but not least it is mentioned that according to the embodiment described here there is also a base through connection 364 which extends vertically through the base structure 310 and which electrically connects the metal layer 322a with the metal layer 322b.

Due to the extremely small Young modulus of the decoupling material the electronic component 350 is mechanically decoupled from both the base structure 310 and the built up of those portions of the upper layer stack 320a, which portions are formed above the decoupling layer structure 330. This decoupling has the effect that with a change of the temperature different CTEs of the component 350 and the other PCB materials above and laterally next to the decoupling layer structure 330 will not cause a strong mechanical stress because this stress is mechanically absorbed by the decoupling layer structure 330. Hence, the tendency to show an unwanted warping of the electronic package will be reduced significantly.

Figure 4:
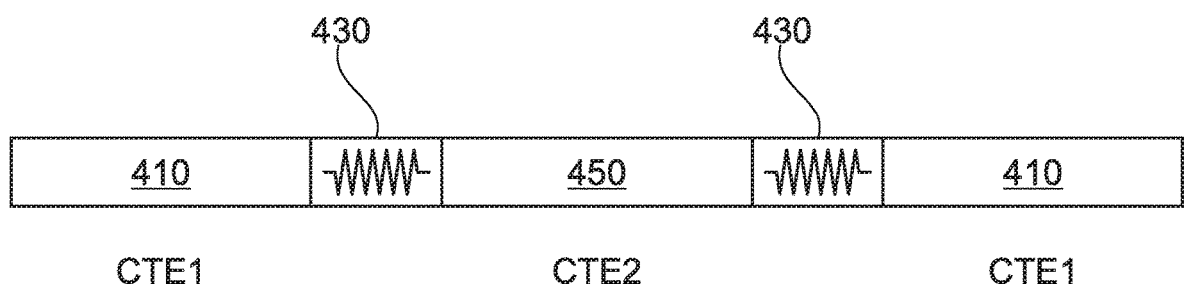
FIG. 4 illustrates a mechanical stress absorption capability of the decoupling material.

FIG. 4 illustrates a mechanical stress absorption capability of the decoupling material. In this Figure, for the ease of illustration, only one layer arrangement is depicted. The depicted layer arrangement corresponds to the (vertical) position and extension of the embedded component. Of course, for embodiments, where e.g. the base structure comprises more than one layer, also FIG. 4 shows more than one single layer arrangement of a corresponding electronic package.

In FIG. 4 the embedded electronic component is denominated with reference numeral 450. The base structure is denominated with reference numeral 410. The decoupling structure respectively the decoupling material, which is filled within the gaps between the base structure 410 and the electronic component 450 is denominated with reference numeral 430. Mechanical springs being symbolically inserted in the decoupling structure 430 illustrate graphically the mechanical stress absorption capability of the decoupling material 430. In FIG. 4, the coefficient of thermal expansion (CTE) of the base structure 410 is indicated with CTE1. The CTE of the embedded component 450 is indicated with CTE2. It is obvious that in case CTE1 and CTE2 are very similar, an unwanted warpage of the depicted layer arrangement will be reduced. However, it has been found out by the inventors that in view of the extremely small Young Modulus of the decoupling material 430 and the corresponding pronounced mechanical stress absorption capability, the CTE of the decoupling material is of only minor relevance for a warpage behavior. In other words, even if the is a significant difference between (i) the CTE of the decoupling material 430 and (ii) CTE1 and/or CTE2, the unwanted effect of warpage would not be seriously increased.

In preferred embodiments the base structure 410 comprises a fiber reinforced material. It has been found out by the inventors that the mechanical stress absorption capability of the decoupling material/structure 430 is further improved if there is no fiber reinforcement provided in the elastic and deformable decoupling structure 430.

Of course, if a soft and deformable material is also provided above and/or below the layer arrangement depicted in FIG. 4, also this soft and deformable material, which could be the same as the decoupling material 430, may also contribute to an absorption of mechanical tensions and/or mechanical stress.

It should be noted that the term "comprising" does not exclude other elements or steps and the use of articles "a" or "an" does not exclude a plurality. Also, elements described in association with different embodiments may be combined.

LIST OF REFERENCE SIGNS

190 diagram
192 deformation curve @ room temperature
194 deformation curve @ 200° C.
Dp plastic/irreversible deformation
De elastic/reversible deformation
Dcr creeping deformation
200 electronic package
210 base structure
222 metal layer (patterned)
230 decoupling layer structure/decoupling material
250 component
260 electric connection structure
262 via interconnects
300 electronic package
310 base structure
320a layer stack
320b layer stack
322 metal layer
322a metal layer
322b metal layer
324 dielectric layer/prepreg layer
324a dielectric layer/prepreg layer
326a solder mask
326b solder mask
330 decoupling layer structure/decoupling material
350 component
360 electric connection structure
362 via interconnects
364 base through connection
410 base structure
430 decoupling layer structure/decoupling material
450 component

The invention claimed is:

1. An electronic package, comprising:
   a base structure;
   a layer stack formed over the base structure; and
   a component embedded at least partially within the base structure and/or within the layer stack;
   wherein the layer stack comprises a decoupling layer structure,
   the decoupling layer structure comprising a decoupling material having a Young Modulus being smaller than 1 GPa;
   wherein the decoupling material mechanically decouples at least partially one portion of the electronic package formed at one side of the decoupling layer structure from another portion of the electronic package formed at the other side of the decoupling layer structure;
   wherein the decoupling material has a Coefficient of Thermal Expansion, CTE,
   wherein at a temperature smaller than the glass transition temperature the CTE is in the range of between 30 ppm and 200 ppm
   and/or wherein at a temperature larger than the glass transition temperature the CTE is in the range between 25 ppm to 800 ppm;
   wherein the component is embedded into the decoupling material such that the decoupling material is in direct contact with the component at at least three sides of the component.

2. The electronic package as set forth in claim 1, wherein the decoupling material comprises a blend of at least one resin and at least one softening component.

3. The electronic package as set forth in claim 1, wherein the decoupling material comprises copolymer,
   wherein at least one softening component is copolymerized into a polymer chain of the copolymer.

4. The electronic package as set forth claim 1, wherein the decoupling material has a Young Modulus smaller than 0.5 GPa.

5. The electronic package as set forth in claim 1, wherein the decoupling material has a Coefficient of Thermal Expansion, CTE,
   wherein at a temperature smaller than the glass transition temperature the CTE is in the range between 30 ppm to 120 ppm.

6. The electronic package as set forth in claim 1, wherein the decoupling material has a Coefficient of Thermal Expansion, CTE,
   wherein at a temperature larger than the glass transition temperature the CTE is in the range between 50 ppm and 400 ppm.

7. The electronic package as set forth in claim 1, wherein the base structure comprises a base material which exhibits a Young modulus being smaller than 5 GPa.

8. The electronic package as set forth in claim 1, wherein at room temperature the decoupling material comprises an elastic deformability being in the range between 1% and 10%.

9. The electronic package as set forth in claim 1, wherein at 200° C. the decoupling material comprises an elastic deformability being in the range between 1% and 10%.

10. The electronic package as set forth in claim 1, wherein at room temperature the decoupling material comprises a plastic deformability being in the range between 0.35% and 8%.

11. The electronic package as set forth in claim 1, wherein at 200° C. the decoupling material comprises a plastic deformability being in the range between 3.7% and 15%.

12. The electronic package as set forth in claim 1, wherein at 200° C. the decoupling material comprises a creeping deformability over 180 minutes being in the range between 0.5% and 6%.

13. The electronic package as set forth in claim 1, wherein the decoupling layer structure is formed directly at at least one side of the component.

14. The electronic package as set forth in claim 13, the electronic package further comprising:
an electric connection structure which is electrically connected with terminals of the component
and which (i) electrically connects the component with other components of the electronic package
and/or which (ii) is configured for electrically connecting the component with circuitry being external to the electronic package,
wherein the electric connection structure is formed at least partially within the decoupling layer structure.

15. The electronic package as set forth in claim 1, wherein a creeping deformability over 180 minutes being in the range between 0.5% and 6%.

16. The electronic package as set forth in claim 1, wherein the decoupling material is a material being free from a mesh.

17. The electronic package as set forth in claim 1, wherein within an XY-plane being parallel to the main planes of the layer stack the embedded component has a length and/or a width of larger than 2 mm.

18. The electronic package as set forth in claim 17, wherein within an XY-plane being parallel to the main planes of the layer stack the area ratio between the area of the component and the area of the entire package is larger than 10%.

19. The electronic package as set forth in claim 1, wherein the electronic package comprises at least one of the following features:
the layer stack comprises at least one electrically insulating layer structure made from a PCB material, and
the layer stack comprises at least one electrically conductive layer structure made from a PCB material.

20. A method for manufacturing an electronic package, the method comprising:
providing a base structure;
forming a layer stack over the base structure, wherein the layer stack comprises a decoupling layer structure,
the decoupling layer structure comprising a decoupling material having a Young Modulus being smaller than 1 GPa; and
embedding a component at least partially within the base structure and/or within the layer stack;
wherein the decoupling material mechanically decouples at least partially one portion of the electronic package formed at one side of the decoupling layer structure from another portion of the electronic package formed at the other side of the decoupling layer structure;
wherein the decoupling material has a Coefficient of Thermal Expansion, CTE,
wherein at a temperature smaller than the glass transition temperature the CTE is in the range of between 30 ppm and 200 ppm
and/or wherein at a temperature larger than the glass transition temperature the CTE is in the range between 25 ppm to 800 ppm;
wherein the component is embedded into the decoupling material such that the decoupling material is in direct contact with the component at at least three sides of the component.

* * * * *